United States Patent
Schlitzkus et al.

(10) Patent No.: US 9,726,565 B2
(45) Date of Patent: Aug. 8, 2017

(54) SUPPORT UNIT FOR A CIRCUIT BOARD IN A SENSOR UNIT AND CORRESPONDING SENSOR UNIT

(71) Applicant: Robert Bosch GmbH, Stuttgart (DE)

(72) Inventors: Michael Schlitzkus, Dietmannsried (DE); Stefan Lehenberger, Weitnau (DE); Dmitriy Aranovich, Pliezhausen (DE); Robert Hengler, Durach (DE); Christian Pfleger, Reutlingen (DE); Philip Martin Lenk, Burgberg (DE); Peter Diesel, Bad Hindelang (DE)

(73) Assignee: Robert Bosch GmbH, Stuttgart (DE)

( * ) Notice: Subject to any disclaimer, the term of this patent is extended or adjusted under 35 U.S.C. 154(b) by 81 days.

(21) Appl. No.: 14/388,713

(22) PCT Filed: Mar. 20, 2013

(86) PCT No.: PCT/EP2013/055780
§ 371 (c)(1),
(2) Date: Sep. 26, 2014

(87) PCT Pub. No.: WO2013/143931
PCT Pub. Date: Oct. 3, 2013

(65) Prior Publication Data
US 2015/0040673 A1    Feb. 12, 2015

(30) Foreign Application Priority Data

Mar. 27, 2012   (DE) ..................... 10 2012 204 911

(51) Int. Cl.
*G01L 19/14*    (2006.01)
*G01L 19/00*    (2006.01)
(Continued)

(52) U.S. Cl.
CPC .......... *G01L 19/148* (2013.01); *G01D 11/245* (2013.01); *G01L 19/0069* (2013.01);
(Continued)

(58) Field of Classification Search
CPC ............. G01L 19/0069; G01L 19/0076; G01L 19/0084; G01L 19/147; G01L 19/148
See application file for complete search history.

(56) References Cited

FOREIGN PATENT DOCUMENTS

| CN | 101233409 A | 7/2008 |
|---|---|---|
| CN | 101652279 A | 2/2010 |

(Continued)

OTHER PUBLICATIONS

International Search Report corresponding to PCT Application No. PCT/EP2013/055780, mailed Jul. 29, 2013 (German and English language document) (5 pages).

*Primary Examiner* — Justin Olamit
(74) *Attorney, Agent, or Firm* — Maginot, Moore & Beck LLP

(57) ABSTRACT

A support unit for a circuit board in a sensor unit comprises a main body that defines an outer contour and includes a first joining geometry and a second joining geometry. The first joining geometry is configured to at least one of guide and electrically contact external contact elements, and includes contact receiving pockets configured to guide the external contact elements, and at least one reinforcement web that separates two adjacent contact receiving pockets. The second joining geometry is configured to join the support unit to the circuit board. The first joining geometry defines at least in part an external interface via which at least one electrical output signal of the circuit board is tapped.

10 Claims, 8 Drawing Sheets

(51) Int. Cl.
*G01D 11/24* (2006.01)
*H05K 1/02* (2006.01)
*H05K 5/00* (2006.01)

(52) U.S. Cl.
CPC ........ *G01L 19/0084* (2013.01); *G01L 19/147* (2013.01); *H05K 1/02* (2013.01); *H05K 5/0091* (2013.01); *H05K 2201/10151* (2013.01)

(56) References Cited

FOREIGN PATENT DOCUMENTS

| | | | | | |
|---|---|---|---|---|---|
| DE | 10 2007 016 473 | A1 | | 10/2008 | |
| DE | 102007016474 | A1 | * | 10/2008 | ......... G01L 19/0069 |
| DE | 10 2009 045 790 | A1 | | 4/2011 | |
| DE | WO 2011047919 | A1 | * | 4/2011 | ......... G01L 19/0069 |
| JP | H08-201203 | A | | 8/1996 | |
| WO | 2009/007286 | A2 | | 1/2009 | |

* cited by examiner

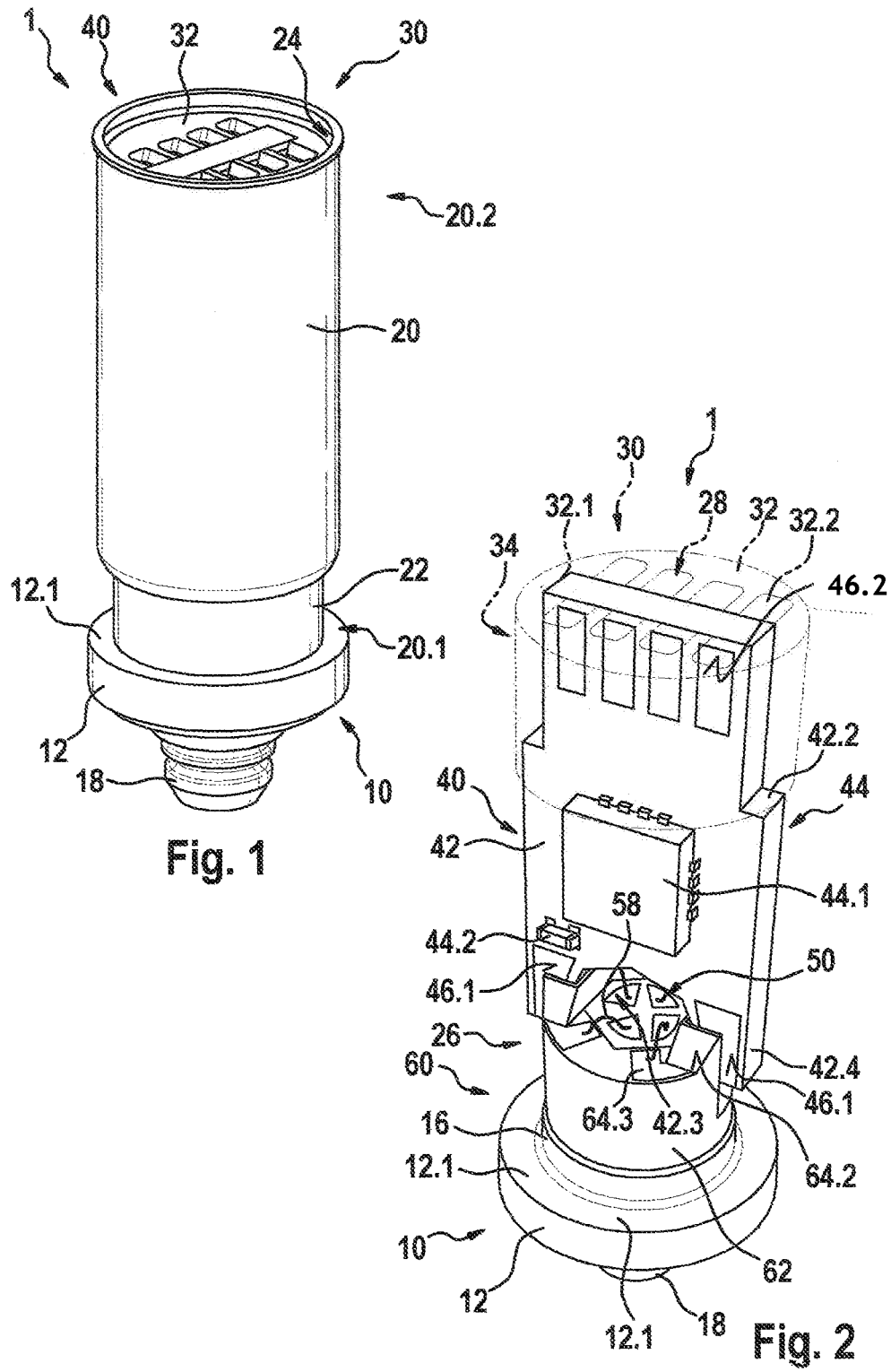

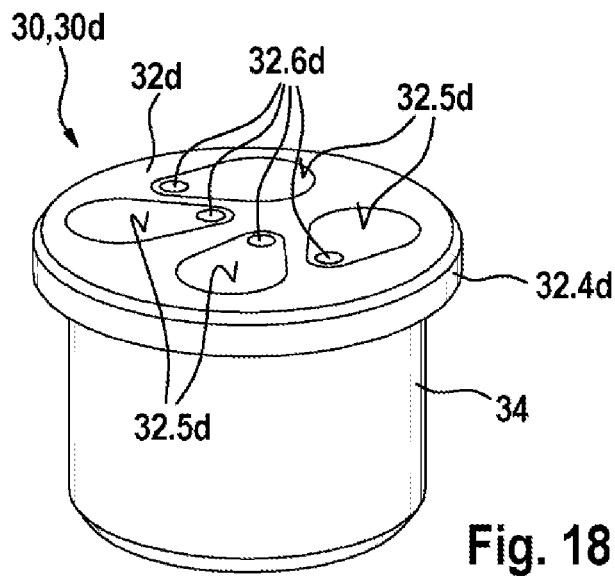
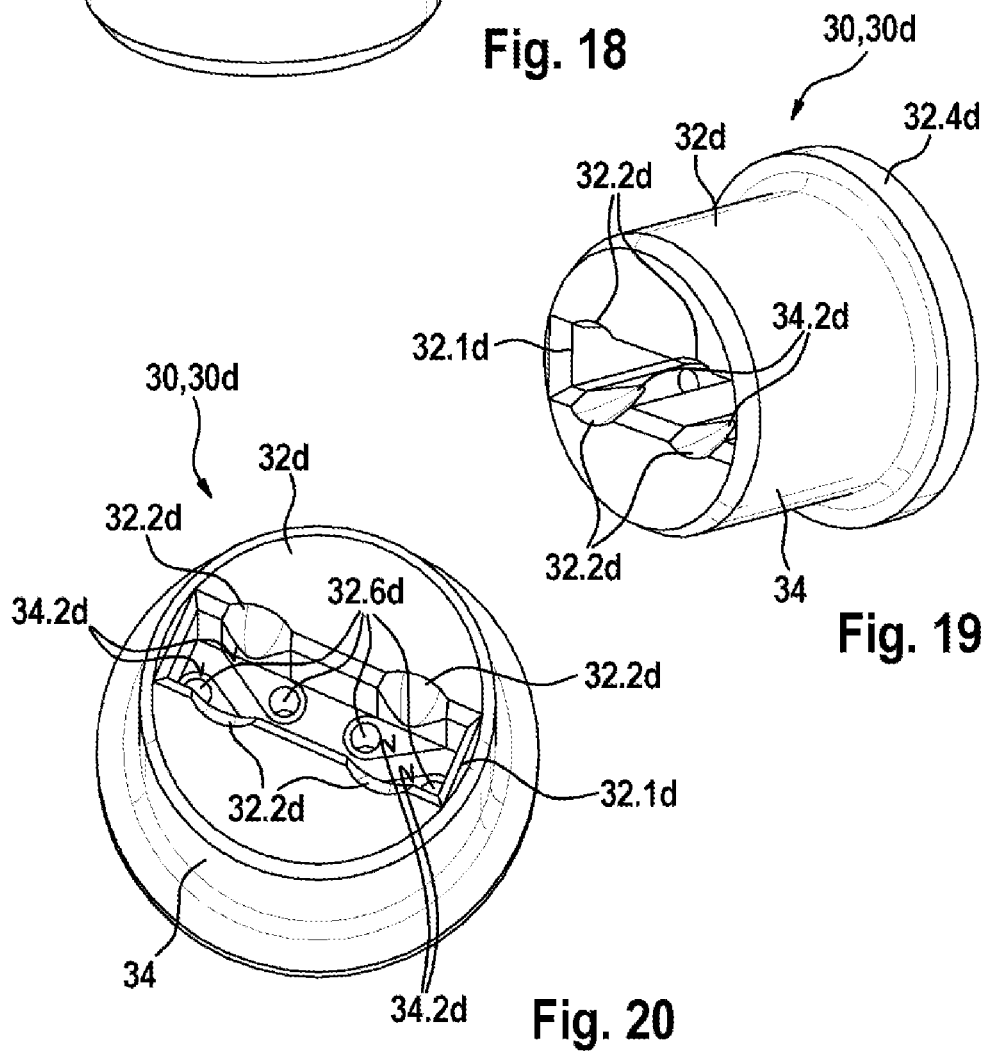

SUPPORT UNIT FOR A CIRCUIT BOARD IN A SENSOR UNIT AND CORRESPONDING SENSOR UNIT

This application is a 35 U.S.C. §371 National Stage Application of PCT/EP2013/055780, filed on Mar. 20, 2013, which claims the benefit of priority to Serial No. DE 10 2012 204 911.8, filed on Mar. 27, 2012 in Germany, the disclosures of which are incorporated herein by reference in their entirety.

The disclosure relates to a support unit for a circuit board in a sensor unit and a corresponding sensor unit.

BACKGROUND

By way of example, a connection unit for a pressure measuring cell is known from WO 2009/007286 A2. The known connection unit comprises a protective sleeve, in which at least one measuring cell, which in particular measures a pressure of a hydraulic block, and a circuit carrier with a vertically disposed circuit board are arranged, which connection unit comprises an electronic circuit with at least one electronic and/or electrical component. The circuit carrier has a lower cylindrical region and an upper cylindrical region, which are interconnected via a rectangular middle portion, wherein the vertically disposed circuit board is arranged parallel to the rectangular middle portion between the two cylindrical portions of the circuit carrier. The pressure measuring cell has at least one connection point, via which at least one electrical output signal of the pressure measuring cell can be tapped. The circuit carrier has an internal interface, which taps the at least one electrical output signal of the pressure measuring cell and applies this to the electronic circuit, and one external interface, via which an output signal of the electronic circuit can be tapped. Here, the internal interface is formed at a first end of the protective sleeve, and the external interface is formed at a second end of the protective sleeve. Furthermore, the circuit carrier has at least one external conductor track for contacting the connection point to the electronic circuit. In addition, at least one contact means is provided, via which an output signal of the electronic circuit can be tapped, wherein the electronic circuit is connected to the contact means via at least one external conductor track of the circuit carrier. The contact between the pressure measuring cell and the circuit carrier or between the circuit carrier and the circuit board or the electronic components is established via corresponding conductive adhesive connections. To produce these conductive adhesive connections, the circuit carrier has conductive adhesive domes and the pressure measuring cell or the circuit board or the electronic components have corresponding conductive adhesive surfaces respectively. The circuit carrier preferably consists at least of a plastic preliminary injection-molded article composed of galvanizable plastic and a second, non-galvanizable plastic, wherein the conductor tracks and the conductive adhesive domes are produced in a galvanic process as a metallic surface coating on the galvanized plastic. To detachably directly contact the connection unit and a built-on control device, the corresponding contact means are preferably formed as contact rivets, which are bonded by means of conductive adhesive into provided openings connected to the conductor tracks.

SUMMARY

By contrast, the support unit according to the disclosure for a circuit board in a sensor unit of the present disclosure has the advantage that the support unit combines the functionality of a mechanical part of the external interface and a supporting function for the circuit board, such that the circuit board can be electrically connected to an external circuit or control device and can be supported against an inner contour of a protective sleeve. Embodiments of the support unit according to the disclosure thus form the connection element between the circuit board or sensor unit and the outside world. The support unit can be mechanically connected to the substantially vertically disposed circuit board by being plugged on and/or bonded.

Embodiments of the support unit according to the disclosure enable an optimization of the installation space of the sensor unit due to the support of the substantially vertically disposed circuit board on the inner contour of the protective sleeve. In addition, additional functions such as the guidance and/or electrical contacting of external contact partners and a contact protection for the contact faces of the circuit board can be integrated. Furthermore, electrical and/or electronic components and/or conductor tracks for a protective circuit and/or an additional ground path can be provided. In addition, contact faces and/or guide means for a demand-associated connection to predefined client interfaces or to a peripheral device can be provided. The sensor unit can thus be adapted variably to the different client interfaces in accordance with the embodiment of the support unit.

Embodiments of the present disclosure provide a support unit for a circuit board in a sensor unit having an external interface, via which at least one electrical output signal of the circuit board can be tapped. In accordance with the disclosure, the support unit comprises a main body having an outer contour, which has a first joining geometry, which is part of the external interface and guides and/or electrically contacts external contact elements, and a second joining geometry, via which the support unit can be joined to the circuit board.

By contrast, the sensor unit according to the disclosure has the advantage that it can be constructed in a particularly compact manner, since the circuit carrier forms only the internal interface and is arranged at the first end of the protective sleeve, and the circuit board within the protective sleeve is formed simultaneously as a structural component and is joined to the circuit carrier at the first end face. At the second end face, the circuit board is joined to the support unit according to the disclosure, which supports the circuit board against the protective sleeve. The overall height of the sensor unit can thus be reduced advantageously.

Embodiments of the sensor unit according to the disclosure have a modular structure, such that a wide range of different sensors and client interfaces can be implemented advantageously. Furthermore, due to the protective sleeve in conjunction with the protective unit and the circuit carrier, an integrated contact protection can be provided, which reduces the likelihood of failure during the assembly or in the field. In addition, redundant contacting possibilities can be provided advantageously for the external interface directly on the circuit board without effective external static contacting force.

The core of the sensor unit according to the disclosure lies in an intelligent combination of different previously discrete structural elements and/or functions in one component part. Such combined component parts have more degrees of freedom and can thus be used in a more versatile manner. Due to the use of a plurality of such combined component parts with multiple functions, a sensor unit is produced from a modular composite, which comprises the circuit carrier, which electrically contacts the measuring cell, the vertically disposed circuit board, which can preferably be fitted with components on either side and is plugged and/or bonded into the circuit carrier, the support element, which is preferably plugged and/or bonded onto the vertically disposed circuit board, and the protective sleeve having a flange, which carries the measuring cell. An electronic circuit is arranged on the circuit board and for example performs a signal amplification and/or a processing of a raw signal of the measuring cell. In addition, with the use of an application-specific integrated circuit (ASIC), a corresponding protective circuit can be provided on the circuit board. As an additional function, guide means for guiding and/or means for electrically contacting external contact means can be provided in the support element, which means form the external interface with the second contact means of the circuit board.

Embodiments of the present disclosure provide a sensor unit which has a protective sleeve, in which at least one measuring cell, which in particular measures a pressure of a hydraulic block, and a circuit carrier with a substantially vertically disposed circuit board are arranged, which can preferably be fitted with components on either side and comprises an electronic circuit having at least one electronic and/or electrical component part. The measuring cell has at least one connection point, via which at least one electrical output signal of the measuring cell can be tapped. The circuit carrier has an internal interface, which taps the at least one electrical output signal of the measuring cell and applies this to the electronic circuit. An output signal of the electronic circuit can be tapped via an external interface. Here, the internal interface is formed at a first end of the protective sleeve and the external interface is formed at a second end of the protective sleeve. In accordance with the disclosure, the sensor unit comprises the above-described support unit, which comprises a main body having an outer contour, which has a first joining geometry, which is part of the external interface and guides and/or electrically contacts external contact elements, and a second joining geometry, via which the support unit can be joined to the circuit board. The support unit via the outer contour supports the circuit board, joined via the second joining geometry, against an inner contour of the protective sleeve.

It is particularly advantageous that the main body of the support unit is formed as a cylinder with a second joining geometry, which is formed as a receiving opening, is adapted to an outer contour of the circuit board and in which the circuit board can be received at least in part. The support unit preferably consists at least of a plastic preliminary injection-molded article composed of a galvanizable first plastic and a non-galvanizable second plastic, wherein conductor tracks and contact means can be applied as a metallic surface coating to the galvanizable plastic by means of a galvanic process. Alternatively, the plastic preliminary injection-molded article can be fabricated from the non-galvanizable second plastic and can be overmolded at least in part with the galvanizable first plastic. By way of example, the protective unit can be produced by means of MID 2C technology, that is to say the injection-molded support unit (molded interconnected device) consists of two components comprising a galvanizable first plastic, which is overmolded at least in part with a non-galvanizable second plastic. Alternatively, the non-galvanizable second plastic can also be overmolded at least in part with the galvanizable first plastic. The partly protruding surfaces of the preliminary injection-molded article are coated by means of a galvanic process with a metallic surface, such that the external conductor tracks and contact means are produced. The use of such an injection-molded MID support unit is particularly well suited in the present case of application, since the miniaturization of the connection unit for the sensor unit can be improved due to the improved freedom of design and the integration of electrical and mechanical functions. The support unit can also be produced selectively by an MID which is directly structured by means of a laser. The MID support unit then consists of an injection-molded part, in which the locations of the conductor tracks and contact means are structured with the aid of a laser and are then coated by means of a galvanic process with a metallic surface. Alternatively, the support unit can also be produced as a lead frame overmolded with plastic.

In an advantageous embodiment of the support unit according to the disclosure, the second joining geometry formed as a receiving opening can be formed by way of example as a continuous opening in the main body formed as a cylinder. Alternatively, the second joining geometry formed as a receiving opening can be formed with a predefined length in the main body formed as a cylinder and can form a stop for the circuit board.

In a further advantageous embodiment of the support unit according to the disclosure, the first joining geometry can have at least one contact receiving pocket for guiding the external contact elements. In addition, the first joining geometry can have at least one reinforcement web, which separates two adjacent contact receiving pockets. An increased stability and an improved guidance of the external contact elements are advantageously produced as a result.

In a further advantageous embodiment of the support unit according to the disclosure, the main body may have a protruding edge. The support unit in the inserted state can terminate a corresponding protective sleeve via this edge. The contact protection and the protection against infiltrating foreign bodies can thus be further improved for the sensor unit.

In a further advantageous embodiment of the support unit according to the disclosure, the outer contour of the main body may have an electrically conductive coating, at least in part. The electrically conductive coating can be electrically contacted in the inserted state with an inner contour of the protective sleeve in order to form an additional ground path. Furthermore, the main body can carry at least one electrical and/or electronic component part and/or at least one conductor track and/or at least one contact face. Advantageously, different client interfaces can thus be reproduced and different electrical functionalities can thus be provided.

Exemplary embodiments of the disclosure are illustrated in the drawings and will be explained in greater detail in the following description. In the drawings, like reference signs denote components or elements that perform like or similar functions.

BRIEF DESCRIPTION OF THE DRAWINGS

FIG. 1 shows a schematic perspective illustration of a first exemplary embodiment of a sensor unit according to the disclosure with a first exemplary embodiment of a support unit according to the disclosure.

FIG. 2 shows a schematic perspective illustration of the sensor unit according to the disclosure from FIG. 1 without protective sleeve.

FIG. 8 shows a schematic perspective illustration of an upper portion of the sensor unit according to the disclosure from FIG. 1 or 2 with the first exemplary embodiment of the support unit according to the disclosure and with external contact means slid on.

FIGS. 18 to 20 each show a schematic perspective illustration of a fifth exemplary embodiment of the support unit according to the disclosure.

DETAILED DESCRIPTION

Figure 3:
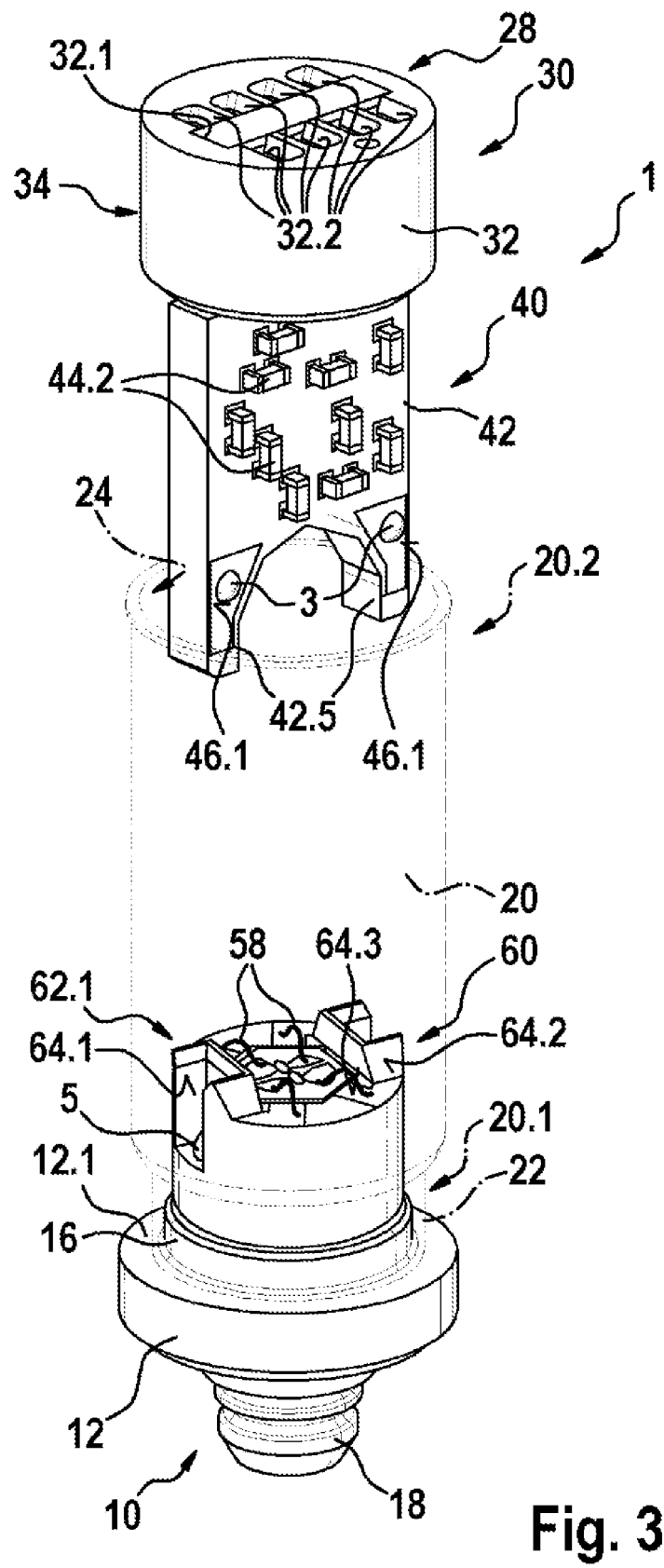
FIG. 3 shows a schematic perspective illustration of a sensor carrier with a joined protective sleeve prior to the joining of the circuit board joined to a support unit according to the disclosure for the sensor unit according to the disclosure from FIG. 1 or 2.

As can be seen from FIGS. 1 to 20, exemplary embodiments of the sensor unit 1, 1a, 1b according to the disclosure in each case comprise a protective sleeve 20, in which at least one measuring cell 50, which in particular measures a hydraulic pressure of a fluid controlled by solenoid valve in a vehicle braking system, and a circuit carrier 60 having a substantially vertically disposed circuit board 40 are arranged. The circuit board 40 can preferably be fitted with components on either side and comprises an electronic circuit 44 having at least one electronic and/or electrical component part 44.1, 44.2, which for example performs a signal amplification and/or a processing of a raw signal of the measuring cell 50. In the case of the illustrated exemplary embodiments, the electronic circuit 44 comprises an application-specific integrated circuit (ASIC) 44.1 and a corresponding protective circuit. The measuring cell 50 converts the hydraulic pressure into at least one electrical output signal and has at least one connection point 54, via which the at least one electrical output signal of the measuring cell 50 can be tapped. The circuit carrier 60 has an internal interface 26, which taps the at least one electrical output signal of the measuring cell 50 and applies this to the electronic circuit 44. In addition, an output signal of the electronic circuit 44 can be tapped via an external interface 28. Here, the internal interface 26 is formed at a first end 20.1 of the protective sleeve 20, and the external interface 28 is formed at a second end 20.2 of the protective sleeve 20. The protective sleeve 20 protects the inner workings of the sensor unit 1, 1a, 1b against excessive mechanical load.

A support unit 30, 30a, 30b, 30c, 30d for the circuit board 40 in the sensor unit 1, 1a, 1b comprises the external interface 28, via which at least one electrical output signal of the circuit board 40 can be tapped. In accordance with the disclosure, the support unit 30, 30a, 30b, 30c, 30d comprises a main body 32, 32a, 32b, 32c, 32d with an outer contour 34, 34a, which has a first joining geometry 32.2, 32.2a, 32.2b, 32.2c, 34.2d, which is part of the external interface 28 and guides and/or electrically contacts external contact elements 70, and a second joining geometry 32.1, 32.1a, 32.1b, 32.1c, 32.1d, via which the support unit 30, 30a, 30b, 30c, 30d can be joined to the circuit board 40.

As is further evident from FIGS. 1 to 20, the main body 32, 32a, 32b, 32c, 32d of the support unit 30, 30a, 30b, 30c, 30d is formed as a cylinder and has a first joining geometry 32.2, 32.2a, 32.2b, 32.2c, 32.2d for the circuit board 40, the first joining geometry being formed as a receiving opening, being adapted to an outer contour 42.2 of the circuit board 40 and receiving the circuit board 40 at least in part. The support unit 30, 30a, 30b, 30c, 30d is introduced with play at the second end 20.2 of the protective sleeve 20 and is slid onto the circuit board 40 via the first joining geometry 32.2, 32.2a, 32.2b, 32.2c, 32.2d formed as a receiving opening. The support unit 30, 30a, 30b, 30c, 30d supports the circuit board 40 against an inner contour 24 of the protective sleeve 20 via the outer contour 34, 34a. In the first four exemplary embodiments, the protective unit 30, 30a, 30b, 30c in each case has a second joining geometry 32.1, 32.1a, 32.1b, 32.1c, 32.1d formed as contact receiving pocket for guiding the external contact means 70.

As is further evident from FIGS. 1, 3, 5, 8, 9 and 13, the protective sleeve 20 in the illustrated exemplary embodiments is formed in each case as a hollow cylinder and at the first end 20.1 has a stepped portion 22. The protective sleeve is joined at the stepped first end 20.1 to a sensor carrier 10, which has a fastening flange 12 and a measuring connection 18, which in the illustrated embodiment of the sensor unit 1, 1a, 1b as a pressure sensor unit is formed as a self-clinch connection. The fastening flange 12 has a flange edge 12.1, on which the protective sleeve 20 is supported and via which the sensor unit 1, 1a, 1b can be calked with a fluid block (not illustrated). In addition, the fastening flange 12 comprises a stepped flange surface 14, wherein the step 16 between the flange edge 12.1 and the flange surface 14 is used in the illustrated exemplary embodiments as a connection region, onto which the protective sleeve 20 is pressed. In addition, the protective sleeve 20 can be welded to the fastening flange 12 at the transition between the step 16 and the flange edge 12.1. The height of the stepped portion 22 or constriction of the protective sleeve 20 is selected such that the calking of the sensor unit 1, 1a, 1b with the fluid block (not illustrated) is possible via the flange edge 12.1 by means of a calking tool. Due to the stepped embodiment at the lower first end 20.1 of the protective sleeve 20, the fastening flange 12 of the sensor carrier 10 can be formed advantageously with a smaller diameter. Alternatively, the protective sleeve 20 can also be formed, however, without a stepped portion 22.

As is further evident from FIGS. 2 to 14, the main body 62 of the circuit carrier 60 in the illustrated exemplary embodiments is formed as a hollow cylinder with an inner joining geometry 62.2, which is formed as a polygon and is adapted to an outer contour 56 of the measuring cell 50 and surrounds the measuring cell 50. Due to the embodiment as a polygon and the associated straight edges, the measuring cell 50 during the production can be cut out easily from a base plate. The outer contour 56 of the measuring cell 50 and thus the inner joining geometry 62.2 of the circuit carrier are preferably formed as a regular hexagon or octagon. The outer joining geometry 62.1 on the main body 62 of the circuit carrier 60 comprises two receiving pockets with protruding collars, which each comprise at least one first contact means 64.1 for electrically contacting the circuit board 40. The at least one first contact means 64.1 is connected via an external conductor track 64.2 on the main body 62 of the circuit carrier 60 to at least one second contact means 64.3 for electrically contacting the measuring cell 50. The first joining geometry 42.3 of the circuit board 40 is formed as a recess in the base carrier 42 and is delimited on two opposite sides in each case by a guide leg 42.4. The two guide legs 42.4 of the first joining geometry 42.3 of the circuit board 40 are each joined to a receiving pocket of the outer joining geometry 62.1 of the circuit carrier 60. In the illustrated exemplary embodiments, the two guide legs 42.4 of the circuit board 40 are guided via inner guide edges 42.5 into the receiving pockets 62.1 of the circuit carrier 60. Additionally or alternatively, the guide legs 42.4 of the circuit board 40 can also be guided via outer guide edges along an inner contour 24 of the protective sleeve 20. Due to an appropriate shaping of the receiving pockets 62.1, the circuit board 40 may have, as required, a predefinable small angle of inclination with respect to the perpendicular vertical axis of the sensor unit 1, 1*a*, 1*b*.

As is further evident from FIGS. 2 to 14, the base carrier 42 of the substantially vertically disposed circuit board 40, in the region of the first joining geometry 42.3, has first contact means 46.1, which, with corresponding first contact means 64.1 in the region of the outer joining geometry 62.1 on the main body 62 of the circuit carrier 60, form the internal electrical interface 26. In the region of the second joining geometry 42.1, the base carrier 42 of the vertically disposed circuit board 40 has second contact means 46.2, which can be contacted by corresponding external contact means 70 (illustrated in FIGS. 8 and 9) and form the external electrical interface 28.

The support unit 30, 30*a*, 30*b*, 30*c*, 30*d* according to the disclosure and/or the circuit carrier 60 are preferably formed using what is known as MID 2C technology, that is to say the support unit 30, 30*a*, 30*b*, 30*c*, 30*d* according to the disclosure and/or the circuit carrier 60 are produced as injection-molded component parts made of plastic using MID technology (molded interconnected device), in particular by means of two-component injection molding. By means of MID technology, three-dimensional circuit structures can be produced. A plastic preliminary injection-molded article made of a galvanizable first plastic is overmolded in part by a non-galvanizable second plastic. Alternatively, the non-galvanizable second plastic may also be overmolded at least in part with the galvanizable first plastic. The partially protruding surfaces of the preliminary injection-molded article are coated by means of a galvanic process with a metal surface, such that the external conductor tracks and/or contact means are produced. The support unit 30, 30*a*, 30*b*, 30*c*, 30*d* according to the disclosure and/or the circuit carrier 60 are characterized by a high freedom of design, in particular due to the integration of electrical and mechanical functions. The sensor unit 1, 1*a*, 1*b* can thus be constructed in a particularly compact manner. In the illustrated exemplary embodiments, the circuit carrier 60 consists at least of a plastic preliminary injection-molded article made of a galvanizable first plastic and a non-galvanizable second plastic. The second contact means 64.3 formed as bonding faces are arranged on an end face of the circuit carrier 60 and are connected via external conductor tracks 64.2 to the corresponding first contact means 64.1, which are formed as contact faces and which are arranged in the receiving pockets of the outer joining geometry 62.1. The first contact means 64.1, the conductor tracks 64.2 and the second contact means 64.3 of the circuit carrier 60 are each formed as a metal layer with predefined dimensions and are applied in a galvanic process to the galvanizable plastic of the circuit carrier 60.

Figure 4:
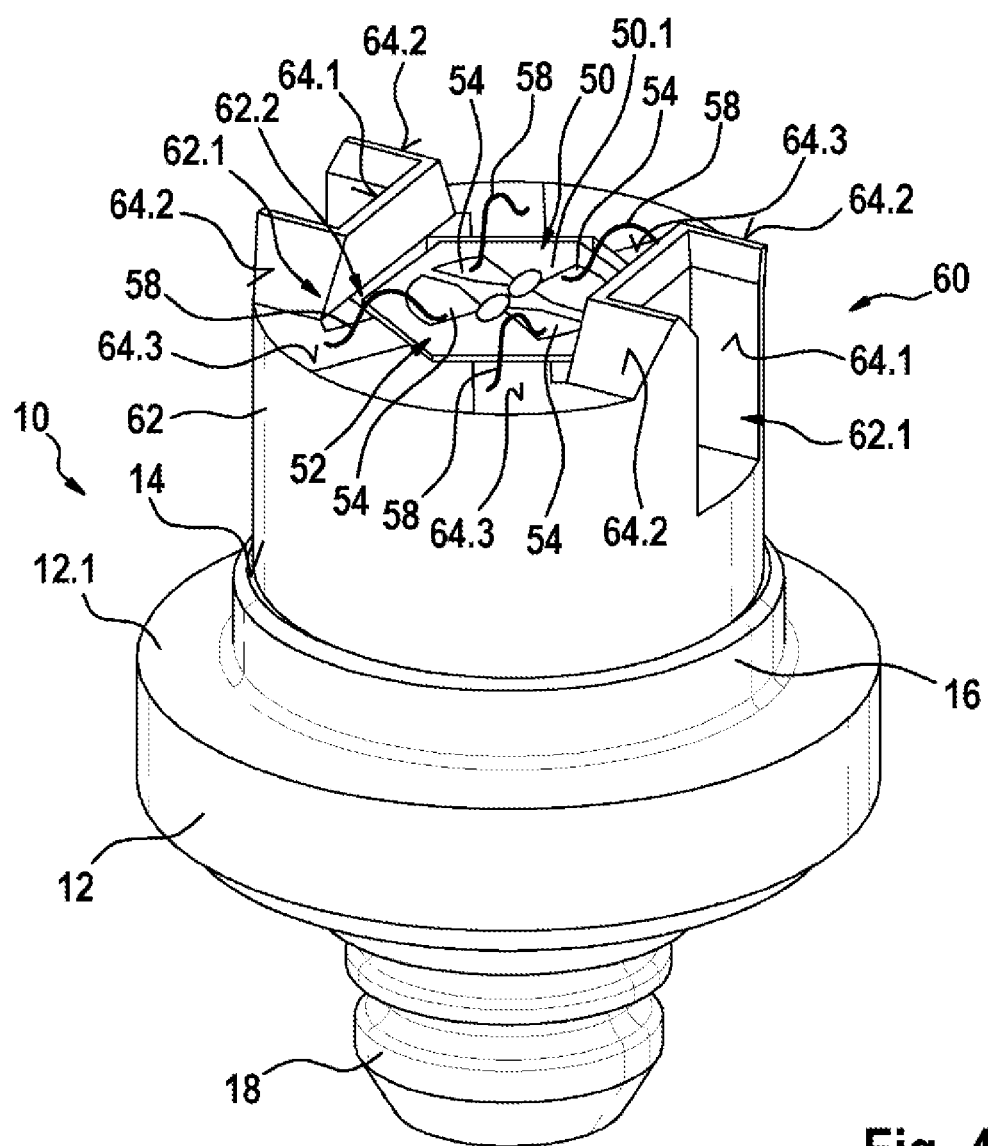
FIG. 4 shows a schematic perspective illustration of the sensor carrier with a joined circuit carrier for the sensor unit according to the disclosure from FIG. 1 or 2.
Figure 5:
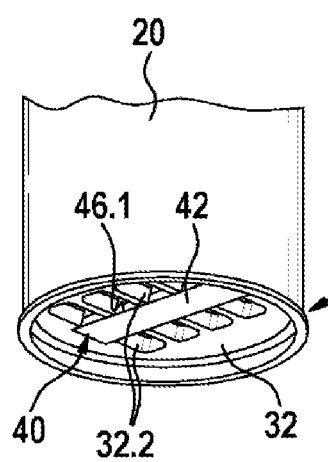
FIG. 5 shows a schematic perspective illustration of an upper portion of the sensor unit according to the disclosure from FIG. 1 or 2 with the first exemplary embodiment of the support unit according to the disclosure. Furthermore, the main body can carry at least one electrical and/or electronic component part and/or at least one conductor track and/or at least one contact face. Advantageously, different client interfaces can thus be reproduced and different electrical functionalities can thus be provided.
Figure 6:
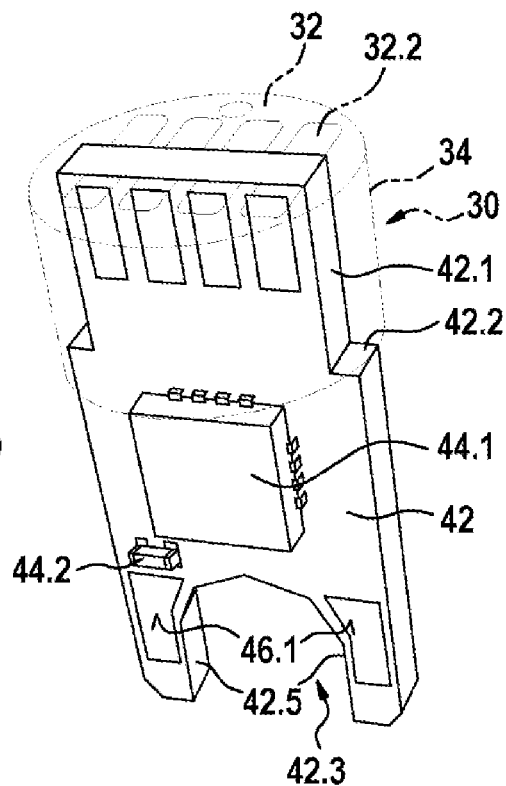
FIG. 6 shows a schematic perspective illustration of the first exemplary embodiment of the support unit according to the disclosure joined to a circuit board for the sensor unit according to the disclosure from FIG. 1 or 2.
Figure 7:
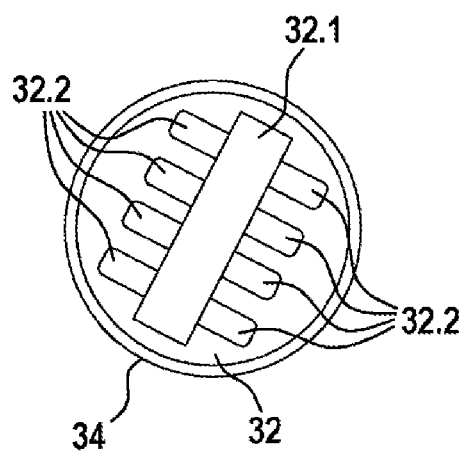
FIG. 7 shows a schematic perspective illustration of the first exemplary embodiment of the support unit according to the disclosure for the sensor unit according to the disclosure according to FIG. 1 or 2.
Figure 8:
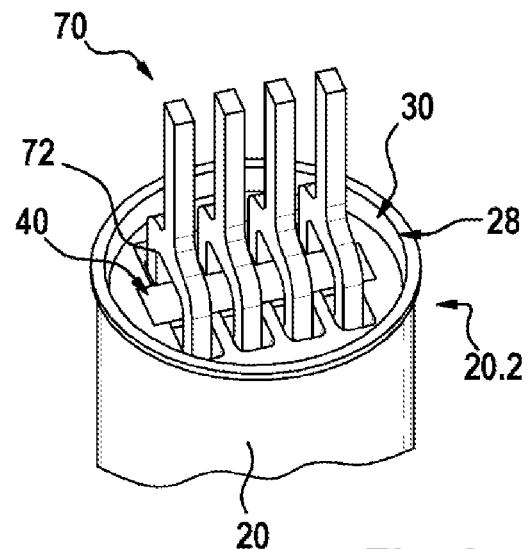
Figure 9:
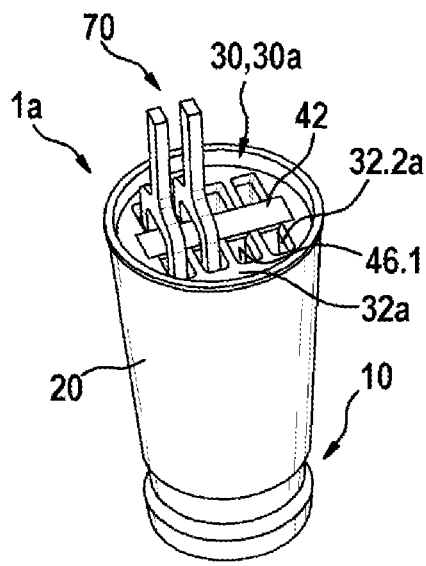
FIG. 9 shows a schematic perspective illustration of a second exemplary embodiment of a sensor unit according to the disclosure with a second exemplary embodiment of a support unit according to the disclosure.
Figure 10:
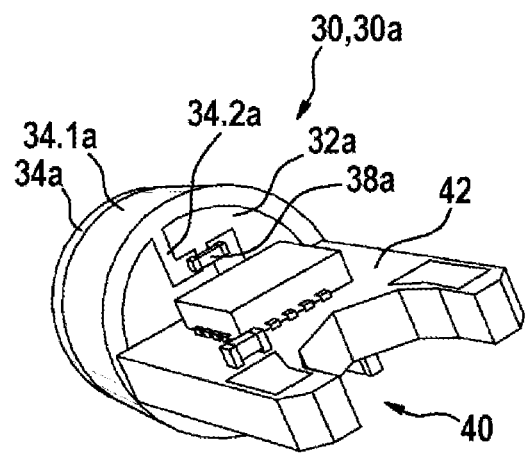
FIG. 10 shows a schematic perspective illustration of the second exemplary embodiment of the support unit according to the disclosure joined to a circuit board for the sensor unit according to the disclosure from FIG. 9.
Figure 11:
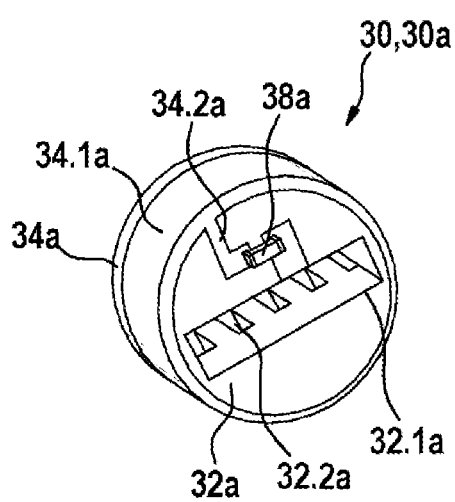
FIGS. 11 and 12 each show a schematic perspective illustration of the second exemplary embodiment of the support unit according to the disclosure for the sensor unit according to the disclosure from FIG. 9.
Figure 12:
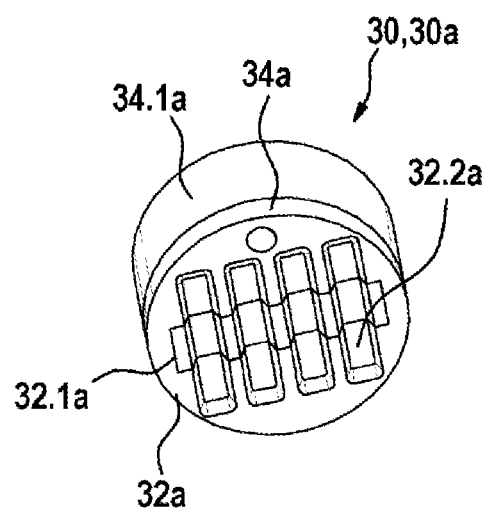

As is further evident from FIG. 4, the fastening flange 12 can be pressed together with or fastened to the fluid block (not illustrated), for example by means of a self-clinch connection 18. Besides the above-described connection region 16 for pressing or welding the protective sleeve 20, connection openings (not visible) are formed in the flange surface 14 and receive connection pins (not visible) arranged on the circuit carrier 60 in order to enable a connection between the circuit carrier 60 and the sensor carrier 10 secured against twisting. To join the circuit carrier 60 to the sensor carrier 10, an adhesive layer can be applied to the flange surface 14. Of course, other suitable connection techniques known to a person skilled in the art can also be used in order to join the circuit carrier 60 to the sensor carrier 10 in a manner secured against twisting. By way of example, a peripheral receiving groove can thus be formed on the fastening flange 12 of the sensor carrier 10, which groove, together with detent lugs or detent clips formed integrally on the main body 62 of the circuit carrier 60, can form a clip connection. The measuring cell 50 formed as a pressure measuring cell is thus fitted on a tubular carrier (not visible) of the fastening flange 12, such that a measuring membrane 50.1 of the measuring cell 50 is deformed depending on the pressure of the fluid in the hydraulic block. The deformation of the measuring membrane 50.1 is measured by a measuring bridge 52. The measuring bridge 52 is connected to four contact points 54, which are each electrically connected via bonding wires 58 to the second contact means 64.3 of the circuit carrier 60 formed as bonding faces.

During the production of the sensor unit 1, 1*a*, 1*b*, the measuring cell 50 is welded to the sensor carrier 10. The circuit carrier 60 is then pressed into and adhesively bonded to the connection openings via the connection pins, wherein the retaining adhesive layer is introduced between the flange surface 14 and a base area of the circuit carrier 60. Following the application of the retaining adhesive layer, the protective sleeve 20 is pressed on and possibly fixed by means of spot welding.

Figure 14:
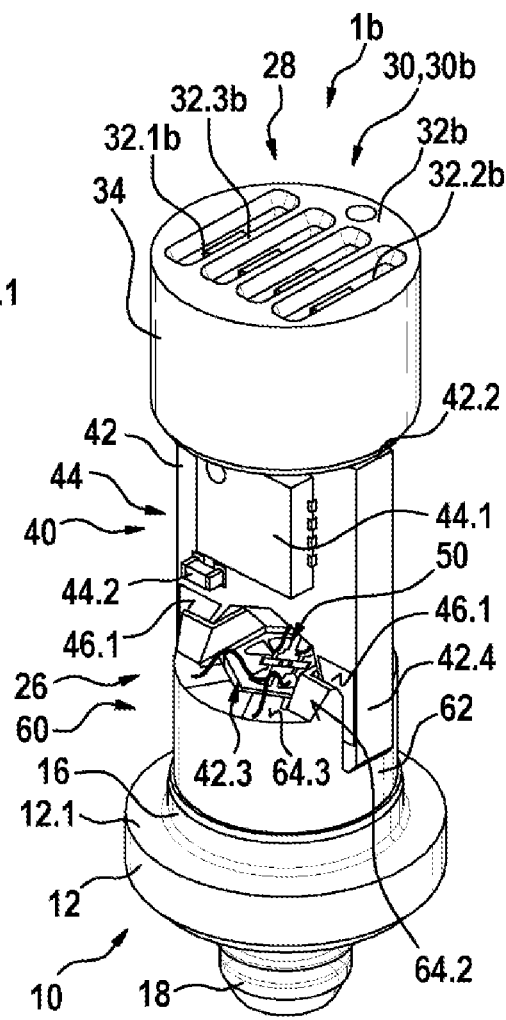
FIG. 14 shows a schematic perspective illustration of the sensor unit according to the disclosure from FIG. 13 without protective sleeve.

As is further evident from FIGS. 2, 3 and 14, the circuit board 40 is inserted into the receiving pockets of the outer joining geometry 62.1 on the main body 62 of the circuit carrier 60 and where applicable is fixed there with retaining adhesive 5 and conductive adhesive 3 in order to ensure an electrically conductive connection between the circuit carrier 60 and the circuit board 40 and in order to fix the circuit board 40. As is further evident from FIG. 3, the retaining adhesive 5 is introduced on base areas of the receiving pockets 62.1 of the circuit carrier 60, and the conductive adhesive 3 is applied to the first contact means 46.1 of the circuit board 40, said contact means being formed as contact faces. Alternatively, the first contact means 64.1 on the main body 62 of the circuit carrier are formed as resilient contact elements, which exert a force, perpendicular to the direction of insertion of the circuit board 40, onto the first contact means 46.1 of the circuit board 40 formed as contact faces and simultaneously fix the circuit board 40 inserted into the receiving pockets of the outer joining geometry 62.1, such that it is possible to dispense with the retaining adhesive 5 and the conductive adhesive 3.

The support unit 30, 30a, 30b, 30c, 30d according to the disclosure can be fitted onto the circuit board 40 prior to or after the joining of the circuit board 40. In addition, a mechanical and/or electrical connection between the circuit board 40 and the support unit 30, 30a, 30b, 30c, 30d can be produced where appropriate by means of conductive and/or retaining adhesive. In order to ensure a reliable electrical and mechanical connection between the circuit board 40 and the circuit carrier 60 at the internal interface 26, the support unit 30, 30a, 30b, 30c, 30d can be fitted prior to the curing of the conductive and/or retaining adhesive at the internal interface 26 in order to ensure, by means of the support of the circuit board 40 on the inner contour 24 of the protective sleeve 20, a force-free or stress-free curing of the conductive adhesive 3 and of the retaining adhesive 5 at the internal interface 26.

As is further evident from FIGS. 2, 3, 6, 10 and 14, the circuit board 40 comprises the planar base carrier 42 with first contact means 46.1 formed as contact faces and second contact means 46.2 formed as redundant contact faces, which are arranged on both sides of the base carrier 42. The second contact means 46.2 can be contacted via external contact means 70, which for example are formed as contact clips having two legs, as can be seen from FIGS. 8 and 9. The external contact means 70 formed as contact clips can thus be slid onto the second contact means formed as redundant contact faces, such that a contact force acts perpendicularly to the direction of insertion of the base carrier 42 of the circuit board 40. Since the contact force is thus applied transversely to the inserted circuit board, the rest of the circuit board 40, in particular the internal interface, can remain free from force. In addition, as a result of this geometry, a greater contact force is possible, such that it is possible advantageously to dispense with costly contact materials, such as gold. As is further evident from FIGS. 2, 3, 6, 10 and 14, the base carrier 42 of the circuit board 40 is narrower in the region of the external interface 28 in order to form the second joining geometry 42.1 with a first guide edge and has a stop shoulder 42.2, against which the support unit 30, 30a, 30b, 30c, 30d rests when the second end face of the circuit board 40 is received by the first joining geometry 32.2, 32.2a, 32.2b, 32.2c, 32.2d formed as a receiving opening, of the support unit 30, 30a, 30b, 30c, 30d in order to guide the support unit 30, 30a, 30b, 30c, 30d and to fix it on the circuit board 40.

As is further evident from FIGS. 1 to 8, the second joining geometry 32.1, in the illustrated first exemplary embodiment of the support unit 30 according to the disclosure formed as a continuous opening, is formed in the main body 32 formed as a cylinder. The first joining geometry 32.2 for guiding the external contact elements 70, in the illustrated first exemplary embodiment, has four contact receiving pockets on each of the two sides of the second joining geometry 32.1 formed as a receiving opening, which pockets ensure the guidance for the external contact elements 70 when slid onto the circuit board 40. Depending on the embodiment of the external client interface 28, the contact pockets of the second joining geometry 32.1 may have additional guide space, in which for example contact springs or contact faces with feedthroughs are arranged in order to electrically contact the second contact means 46.2 of the circuit board 40.

As is further evident from FIGS. 9 to 12, the second joining geometry 32.1a formed as a receiving opening, in the illustrated second exemplary embodiment of the support unit 30a according to the disclosure similarly to the first exemplary embodiment, is formed as a continuous opening in the main body 32a formed as a cylinder. Similarly to the first exemplary embodiment, the first joining geometry 32.2a for guiding the external contact elements 70 in the illustrated second exemplary embodiment likewise has four contact receiving pockets on each of the two sides of the second joining geometry 32.1a formed as a receiving opening, which pockets ensure the guidance for external contact elements 70 when slid onto the circuit board 40. In contrast to the first exemplary embodiment, the second exemplary embodiment of the support unit 30a according to the disclosure has a main body 32a, of which the outer contour 34a has an electrically conductive coating 34.1a, at least in part, which can be electrically contacted with an inner contour 24 of the protective sleeve 20. A ground path between the circuit board 40 and the protective sleeve 20 can thus be formed via the support unit 30a. In addition, the main body 32a of the support unit 30a in the illustrated second exemplary embodiment carries at least one electrical and/or electronic component part 38a and/or at least one conductor track 34.2a. Different client interfaces can thus advantageously be reproduced, and different electrical functionalities, such as an additional protective path for ESD and/or EMC, etc., can thus advantageously be provided.

Figure 13:
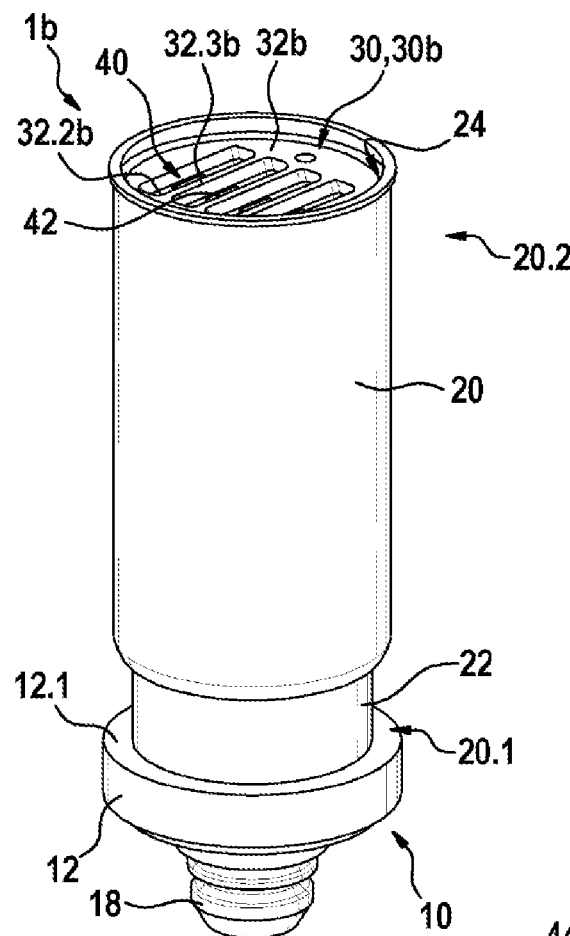
FIG. 13 shows a schematic perspective illustration of a third exemplary embodiment of a sensor unit according to the disclosure with a third exemplary embodiment of a support unit according to the disclosure.

As is further evident from FIGS. 13 and 14, the second joining geometry 32.1b formed as a receiving opening is not formed as a continuous opening in the illustrated third exemplary embodiment of the support unit 30b according to the disclosure, but is formed with a predefined length in the main body 32b formed as a cylinder and forms an inner stop for the circuit board 40. The first joining geometry 32.2b for guiding the external contact elements 70, in the illustrated third exemplary embodiment, has four contact receiving pockets, which cross the second joining geometry 32.1b formed as a receiving opening. To improve the guidance properties when sliding the external contact elements 70 onto the circuit board 40, the first joining geometry 32.2b in the illustrated third exemplary embodiment has reinforcement webs 32.3b, which in each case separate the insertion openings of two adjacent contact receiving pockets.

Figure 15:
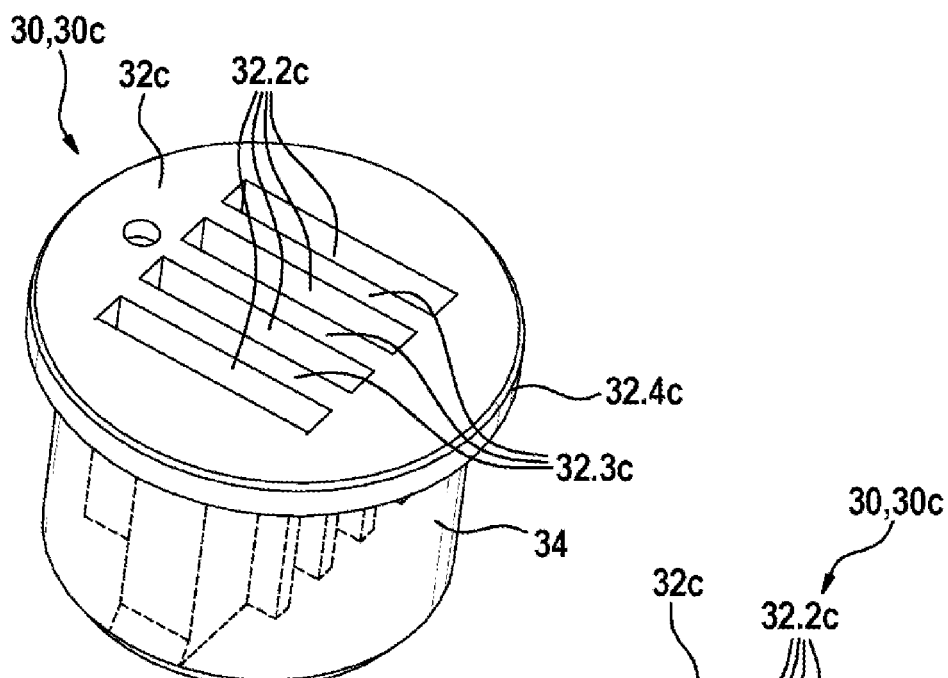
FIGS. 15 to 17 each show a schematic perspective illustration of a fourth exemplary embodiment of the support unit according to the disclosure.
Figure 16:
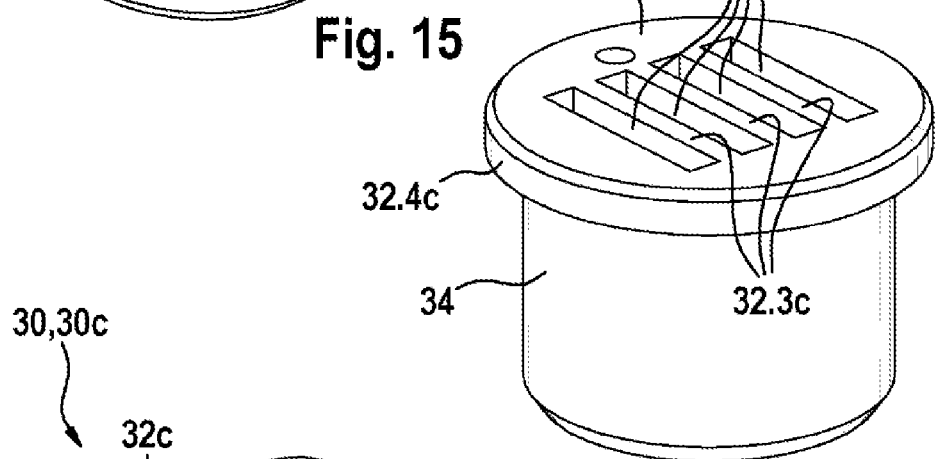
Figure 17:
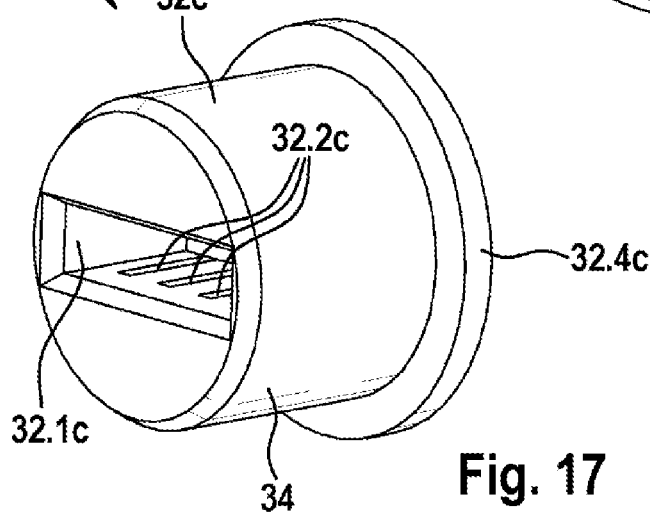

As is further evident from FIGS. 15 to 17, the second joining geometry 32.1c formed as a receiving opening likewise is not formed as a continuous opening in the illustrated fourth exemplary embodiment of the support unit 30c according to the disclosure, similarly to the third exemplary embodiment, but is formed with a predefined length in the main body 32c formed as a cylinder and forms an inner stop for the circuit board 40. The first joining geometry 32.2b for guiding the external contact elements 70 also has four contact receiving pockets in the illustrated fourth exemplary embodiment, which pockets cross the second joining geometry 32.1 formed as a receiving opening. To improve the guidance properties when sliding the external contact elements 70 onto the circuit board 40, the first joining geometry 32.2c also has reinforcement webs 32.3c in the illustrated fourth exemplary embodiment, which in each case separate the insertion openings of two adjacent contact receiving pockets. In contrast to the other exemplary embodiments, the main body 32*c* of the support unit 30*c* is stepped and has a protruding edge 32.4*c*, which terminates the protective sleeve 20 in the inserted state. Below the protruding edge 32.4*c*, the outer contour 34 of the main body 32*c* is adapted to the inner contour 24 of the protective sleeve 20, similarly to the other exemplary embodiments.

As is further evident from FIGS. 18 to 20, the second joining geometry 32.1*d* formed as a receiving opening likewise is not formed as a continuous opening in the illustrated fifth exemplary embodiment of the support unit 30*d* according to the disclosure, similarly to the third and fourth exemplary embodiment, but is formed with a predefined length in the main body 32*d* formed as a cylinder and forms an inner stop for the circuit board 40. In contrast to the third and fourth exemplary embodiment, the first joining geometry 32.2*d* has no contact receiving pockets for guiding the external contact elements 70. In the illustrated fifth exemplary embodiment, the first joining geometry 32.2*d* has four receiving pockets arranged in the interior of the main body 32.*d* and having an electrically conductive coating, which in each case are electrically connected via conductor tracks 34.2*d* and feedthroughs 32.6*d* to external contact faces 32.5*d*, which can be electrically contacted with external contact elements. The coated receiving pockets of the first joining geometry 32.2*d* receive conductive adhesive, via which the electrically conductive coating of the receiving pockets of the first joining geometry 32.2*d* can be electrically contacted with a corresponding first contact means 46.1, formed as a contact face, on the circuit board. Similarly to the fourth exemplary embodiment, the main body 32*d* of the support unit 30*d* is stepped and has a protruding edge 32.4*d*, which terminates the protective sleeve 20 in the inserted state. Below the protruding edge 32.4*d*, the outer contour 34 of the main body 32*d* is adapted to the inner contour 24 of the protective sleeve 20, similarly to the other exemplary embodiments.

The described support unit according to the disclosure for a circuit board is particularly suitable for use in a pressure sensor unit for braking systems of motor vehicles, but is not limited hereto. The support unit according to the disclosure for a circuit board may thus also be used, by way of example, for optical and/or acoustic measuring cells. In particular in the case of premium-class braking systems, a multiplicity of pressure sensors are used with only limited installation space. A pressure sensor unit having minimized installation space is therefore suitable precisely for this application.

Embodiments of the support unit according to the disclosure advantageously support the circuit board against the protective sleeve and prevent a tilting of the circuit board. In addition, embodiments of the support unit according to the disclosure advantageously provide contact protection for the sensor electronics and a guide for the external contact elements.

The invention claimed is:

1. A support unit for a circuit board in a sensor unit for electrical connection to a separate external device having external contact elements comprising:
an elongated main body defining an outer contour and including: (i) a first joining geometry configured to guide the external contact elements into electrical contact with the circuit board; and (ii) a second joining geometry defined in the main body and configured to join the support unit to the circuit board,
wherein the first joining geometry has: (i) elongated contact receiving pockets configured to guide the external contact elements by which the separate external device is engaged to the support unit; and (ii) at least one elongated reinforcement web which separates two adjacent contact receiving pockets;
wherein the first joining geometry defines at least in part an external interface via which at least one electrical output signal of the circuit board is tapped,
wherein said receiving pockets open at a top surface of one end of said elongated main body and said second joining geometry is configured as a receiving opening open at an opposite end of said elongated main body.

2. The support unit as claimed in claim 1, wherein:
the main body is configured as a cylinder with the second joining geometry;
the receiving opening is arranged to intersect said contact receiving pockets and adapted to an outer contour of the circuit board; and
the second joining geometry is configured to receive the circuit board at least in part.

3. The support unit as claimed in claim 2, wherein the second joining geometry is defined as a continuous opening in the main body.

4. The support unit as claimed in claim 2, wherein the second joining geometry is defined on a length of the main body and includes a stop for the circuit board.

5. The support unit as claimed in claim 1, wherein the main body includes a protruding edge.

6. A support unit for a circuit board in a sensor unit for electrical connection to a separate external device having external contact elements comprising:
a main body defining an outer contour and including: (i) a first joining geometry configured to guide the external contact elements into electrical contact with the circuit board; and (ii) a second joining geometry defined in the main body and configured to join the support unit to the circuit board,
wherein the first joining geometry has: (i) elongated contact receiving pockets configured to guide the external contact elements by which the separate external device is engaged to the support unit; and (ii) at least one elongated reinforcement web which separates two adjacent contact receiving pockets;
wherein the first joining geometry defines at least in part an external interface via which at least one electrical output signal of the circuit board is tapped; and
wherein the outer contour of the main body has an electrically conductive coating, at least in part.

7. The support unit as claimed in claim 1, wherein the main body carries at least one of: (i) at least one electrical component part; (ii) at least one electronic component part; (iii) at least one conductor track; and (iv) at least one contact face.

8. A sensor unit comprising:
a protective sleeve defining an inner contour, a first end, and a second end;
at least one measuring cell configured to measure a pressure of a hydraulic block and including at least one connection point via which at least one electrical output signal of the measuring cell is tapped;
an electronic circuit having at least one of an electronic and electrical component part;
a circuit carrier including an internal interface configured to tap the at least one electrical output signal of the measuring cell and apply the at least one electrical output signal to the electronic circuit;

a vertically disposed circuit board, wherein the at least one measuring cell, the circuit carrier, and the circuit board are positioned in the protective sleeve; and a support unit including an elongated main body defining an outer contour and having: (i) a first joining geometry configured to guide-external contact elements of a separate external device into electrical contact with the circuit board; and (ii) a second joining geometry defined in the main body and joining the support unit to the circuit board, wherein the first joining geometry has: (i) elongated contact receiving pockets configured to guide the external contact elements by which the separate external device is engaged to the support unit; and (ii) at least one elongated reinforcement web which separates two adjacent contact receiving pockets;

wherein the first joining geometry defines at least in part an external interface via which the at least one electrical output signal of the circuit board is tapped;

wherein said receiving pockets open at a top surface of one end of said elongated main body and said second joining geometry is configured as a receiving opening open at an opposite end of said elongated main body, wherein the internal interface is positioned at a first end of the protective sleeve and the external interface is positioned at the second end of the protective sleeve; and wherein the outer contour of the support unit supports the circuit board against the inner contour of the protective sleeve.

9. The sensor unit as claimed in claim 8, wherein the main body has a protruding edge which terminates the protective sleeve in an inserted state.

10. The sensor unit as claimed in claim 8, wherein the outer contour of the main body has an electrically conductive coating, at least in part, configured to electrically contact the inner contour of the protective sleeve.

* * * * *